(12) United States Patent
Ishikawa et al.

(10) Patent No.: US 6,734,747 B1
(45) Date of Patent: May 11, 2004

(54) PIEZOELECTRIC OSCILLATOR

(75) Inventors: Masayuki Ishikawa, Kouza-gun (JP); Hideaki Kohzu, Kouza-gun (JP); Yukio Naito, Kouza-gun (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 0 days.

(21) Appl. No.: 09/679,984

(22) Filed: Oct. 5, 2000

(30) Foreign Application Priority Data

Oct. 12, 1999 (JP) .......................................... 11-289298

(51) Int. Cl.[7] ................................................. H03B 5/32
(52) U.S. Cl. ............. 331/158; 331/116 R; 331/116 FE; 331/177 V; 331/36 C
(58) Field of Search ............................ 331/158, 116 FE, 331/116 R, 36 C, 177 V, 185

(56) References Cited

U.S. PATENT DOCUMENTS 4,827,226 A * 5/1989 Connell ................ 331/116 FE
4,851,792 A * 7/1989 Ochiai et al. ................ 331/176
5,764,112 A * 6/1998 Bal et al. ................ 331/116 FE

FOREIGN PATENT DOCUMENTS

JP          H11-088052          3/1999

* cited by examiner

Primary Examiner—Arnold Kinkead
(74) Attorney, Agent, or Firm—Koda & Androlia

(57) ABSTRACT

A piezoelectric oscillator is disclosed which falls under the category of an oscillator including a piezoelectric resonator, an amplifier, and a variable-capacitance element. The variable-capacitance element is a MOS construction type capacitance element, one terminal of that is fixed at a V voltage, and the other terminal of that is applied with a control voltage falling within a range whose intermediate value is the V voltage. As a result of this, a piezoelectric oscillator is realized which can vary its frequency over a wide range even without use of a minus power supply.

6 Claims, 7 Drawing Sheets

PIEZOELECTRIC OSCILLATOR

BACKGROUND OF THE INVENTION

1. Field of the Invention

The present invention relates to a piezoelectric oscillator and, more particularly, to a piezoelectric oscillator that uses a MOS construction type capacitance element.

2. Description of the Related Art

Various forms of circuits have hitherto been proposed and put to practical use as an oscillator that uses a piezoelectric resonator that is represented by a crystal resonator. They are being used in a wide variety of electronic appliances, for example, as signal sources of portable telephones, computers, etc.

On the other hand, in each of such oscillators, for achieving various objects that include making adjustments of the frequency at the time of the manufacture, realizing the channel-frequency-adjusting function or AFC (automatic frequency control) function, etc. and that further include making compensations for the frequency in connection with the temperatures, conforming the oscillator to a large number of channel frequencies, etc., it is indispensable to use a variable-capacitance element.

As a circuit that can realize such objects, there is generally used a circuit that is illustrated in, for example, FIG. 6.

The oscillation circuit illustrated in the figure is an ordinary circuit of the crystal oscillator using an inverter amplifier. In this oscillation circuit, between an input and an output of an inverter amplifier 101 there is inserted a parallel circuit comprised of a crystal resonator 102 and a feedback resistor R1. Also, between the input and the output thereof and the ground there are inserted a capacitor C1 and a capacitor C2, respectively. Simultaneously, to either one of the capacitor C1 and the capacitor C2 (in this example to the capacitor C1) there is connected a variable-capacitance diode D1 serving as a variable-capacitance element. And, a cathode of the variable-capacitance diode D1 and a control terminal Vcont are connected to each other via a resistor R2 for preventing the flow of direct currents.

Because the operation of this oscillation circuit is well known, it is thought unnecessary to newly give an explanation of it. Briefly explaining, however, in this oscillation circuit, according to a direct current voltage that is applied to the control terminal Vcont, the capacitance value of the variable-capacitance diode D1 varies. For this reason, by controlling this control voltage, it is possible to perform various kinds of adjustments of the frequency, for example, AFC and so forth as mentioned above.

On the other hand, in view of the recent demands for miniaturization, and reduction in the power consumption, of various kinds of electronic appliances, there has been also a demand for conversion of the above-described oscillator to an IC version.

However, in a case where converting the oscillation circuit including the variable-capacitance diode D1, such as that illustrated in FIG. 6, to an IC version, this diode cannot but be formed using a process step different from that for forming other semiconductor circuits. Therefore, this diode has been an obstacle to cheaply converting the oscillation circuit to an IC version.

Namely, the variable-capacitance diode D1 which is a bipolar type of semiconductor must be formed using a process step separate from that for forming the inverter amplifier 101 which is generally a C-MOS type of semiconductor. Therefore, the process for such formations is not only complex but the IC product was high in cost.

On the other hand, as a variable-capacitance element suited to conversion to IC version, there is known a MOS construction type capacitance element, the utilization of that has been in expectation.

As a crystal oscillator using such a MOS construction type capacitance element, there is the one that is disclosed, for example, in Japanese Patent Application Laid-Open No. 10-13155 entitled "Crystal Resonator with Frequency-Adjusting Function".

This crystal oscillator is constructed as follows. As illustrated in FIG. 7, between an input terminal and an output terminal of an inverter amplifier 101 there is inserted a parallel circuit comprised of a crystal resonator 102 and a feedback resistor R1. Additionally, a capacitor C2 is connected to the output terminal of the inverter amplifier 101, and a MOS construction type capacitance element 103 is connected to the input terminal of the inverter amplifier. And, simultaneously, an electric-charge injection terminal TI of the MOS construction type capacitance element 103 and a control terminal Vcont are connected to each other.

As the MOS construction type capacitance element 103, although it is only a mere one example, there is known the one illustrated in FIG. 8. Namely, in this element 103, a positive or negative voltage is applied to the control terminal Vcont by using the N type substrate as a basis to thereby cause the flow of a tunnel current through the interior of $SiO_2$ to thereby cause electrons to inject into or come out of a floating electrode 104.

Namely, for example, in a case where having applied a positive voltage to the control terminal Vcont, electrons flow out of the floating electrode 104. Therefore, the thickness of a depletion layer 105 situated near the floating electrode 104 becomes narrow, with the result that with a decrease in that thickness the depletion layer capacitance increases.

Also, in a case where having applied a negative voltage to the control terminal Vcont, the operation reverse to that mentioned above occurs. So, an explanation thereof is omitted.

However, as will be explained below, fundamentally, the MOS construction type capacitance element can have its capacitance value varied over a wide range only with use of a positive power supply or negative power supply. For this reason, there was the drawback that almost no change in the capacitance value occurred when merely using only either a positive, or a negative, single-polarity power supply alone.

This will hereafter be explained in a little more detail.

FIG. 9 is a graph illustrating an example of the relationship between an inter-electrode voltage and a capacitance value of the MOS construction type capacitance element.

As clear from this figure, in this example, when the terminal-to-terminal voltage varies within a range of from −1.5V to +0.5V including therein 0V therebetween, the capacitance value changes over a range covering approximately 80 pF.

However, on the other hand, in the crystal oscillator, whereas the range within that the frequency is variable need generally be wide, it is more preferable that the capacitance value be gently varied with respect to the change in the control voltage than that sharply in order to perform high-precision frequency control. For this reason, there has been a demand for a variable-capacitance element whose capacitance value varies over a wide range of control voltage.

Accordingly, in the case of the crystal oscillator such as that illustrated in FIG. 7, in order to obtain a wide range of variable capacitance with use of the MOS construction type capacitance element 103, it is necessary to use control voltage sources for applying both positive and negative voltages to the control terminal Vcont. Therefore, there was the problem that the construction of the system making control of the frequency became complex.

SUMMARY OF THE INVENTION

The present invention has been made in order to solve the above-described problems and has an object to provide a small-sized piezoelectric oscillator which, while using a MOS construction type capacitance element suited to conversion to an IC version, enables obtaining a wide range of changes in the variable capacitance even with use of either a positive, or a negative, single-polarity power supply, and which facilitates the frequency control.

To attain the above object, according to the first aspect of the invention, there is provided a piezoelectric oscillator wherein, in an oscillator including a piezoelectric resonator, an amplifier, and a variable-capacitance element, the variable-capacitance element is a MOS construction type capacitance element, one terminal of that is applied with an alternating current voltage, whose intermediate voltage is a V voltage, and the other terminal of that is applied with a control voltage falling within a range whose intermediate value is the voltage.

According to the second aspect of the invention, there is provided a piezoelectric oscillator wherein, in an inverter piezoelectric oscillator in which a piezoelectric resonator is connected between an input terminal and an output terminal of an inverter amplifier; and divisional capacitors C1 and C2 are connected between respective ends of the piezoelectric resonator and the ground, by inserting a MOS construction type capacitance element in series with the piezoelectric resonator, one end of the MOS construction type capacitance element is applied with a bias voltage which is the V voltage at an output end or input end of the inverter amplifier and the other end thereof has supplied thereto a control voltage that varies within a range whose intermediate value is the V voltage.

According to the third aspect of the invention, there is provided a piezoelectric oscillator wherein, in an inverter piezoelectric oscillator in which a piezoelectric resonator is connected between an input terminal and an output terminal of an inverter amplifier; and divisional capacitors C1 and C2 are connected between respective ends of the piezoelectric resonator and the ground, two MOS construction type capacitance elements are inserted respectively on both sides of the piezoelectric resonator; one end of each of the MOS construction type capacitance elements is applied with an alternating current voltage, whose intermediate voltage is a V voltage; and the other end thereof is applied with a control voltage that varies within a range whose intermediate value is the V voltage.

According to the fourth aspect of the invention, there is provided a piezoelectric oscillator wherein, in an inverter oscillator in which a piezoelectric element is connected to an input or output end of an inverter amplifier; and divisional capacitors C1 and C2 are connected between respective ends of the piezoelectric element and the ground, a MOS construction type capacitance element is inserted between the piezoelectric resonator and an input end of the inverter amplifier or between the piezoelectric resonator and an output end of the inverter amplifier, a control voltage Vcont is applied to the terminal on a connection-to-piezoelectric resonator side of the MOS construction type capacitance element; and, when it is assumed that V represents the voltage that is a direct current bias voltage at the input end or output end of the inverter amplifier and that is applied to one end of the MOS construction type capacitance element, it is arranged that said voltage becomes an intermediate voltage of the control voltage Vcont.

According to the fifth aspect of the invention, there is provided a piezoelectric oscillator wherein, in an inverter oscillator in which a piezoelectric element is connected to an input or output end of an inverter amplifier; and divisional capacitors C1 and C2 are connected between respective ends of the piezoelectric element and the ground, a MOS construction type capacitance element is inserted between the piezoelectric resonator and an input end of the inverter amplifier or between the piezoelectric resonator and an output end of the inverter amplifier and a control voltage Vcont is applied to the terminal on the connection-to-piezoelectric resonator side of the MOS construction type capacitance element; a direct current circuit of a resistor and a capacitor is inserted and connected between the terminal on the inverter-amplifier side of the MOS construction type capacitance element and the input or output terminal of the inverter amplifier; and further a direct current bias voltage is applied to the terminal on the inverter-amplifier side of the MOS construction type capacitance element.

According to the sixth aspect of the invention, there is provided a piezoelectric oscillator according to the fifth aspect of the invention, wherein the amplitude level of an alternating current supplied to the MOS construction type capacitance element is adjusted according to the value of the resistance of the direct current circuit; and when it is assumed that V represents the direct current bias voltage supplied to the terminal on the inverter-amplifier side of the MOS construction type capacitance element, it is arranged that the direct current bias voltage V becomes an intermediate voltage of the control voltage Vcont.

DETAILED DESCRIPTION OF THE PREFERRED EMBODIMENTS

The present invention will hereafter be explained in detail on the basis of the illustrated embodiments thereof.

Figure 1:
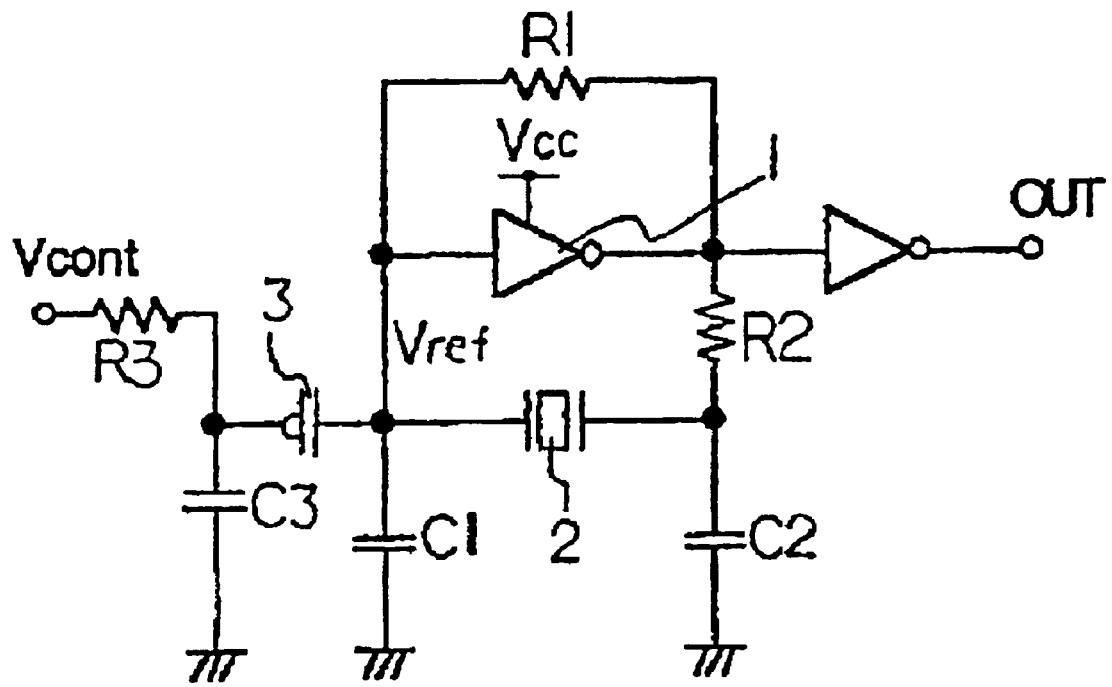
FIG. 1 is a circuit diagram illustrating an embodiment of a crystal oscillator according to the present invention.

FIG. 1 is a circuit diagram illustrating an embodiment of a voltage-controlled crystal oscillator according to the invention.

The crystal oscillator illustrated in FIG. 1 has the following construction. Between input and output terminals of an inverter amplifier 1, whose power source voltage is Vcc, there are respectively inserted in parallel a feedback resistor R1 and a series circuit consisting of a crystal resonator 2 and a resistor R2. And, between the input terminal of the inverter amplifier 1 and the ground there is inserted a capacitor C1 while, on the other hand, between one end of the crystal resonator 2 and the ground there is inserted a capacitor C2. Further, between the other end of the crystal resonator 2 and the ground there is grounded via a capacitor C3 a MOS construction type capacitance element 3 while, on the other hand, a point of connection between the MOS construction type capacitance element 3 and the capacitor C3 is connected to a control terminal Vcont via a resistor R3.

Next, the operation of the crystal oscillator having the above-described construction will be explained.

It is to be noted that since the operation of the inverter oscillation circuit is well known, an explanation thereof is omitted.

As apparent from the above-described explanation as well, the crystal oscillator illustrated in FIG. 1 is constructed in such a form wherein one terminal of the MOS construction type capacitance element 3 is connected to the input terminal of the inverter amplifier 1. Therefore, as a result of this, to the other end of the MOS construction type capacitance element 3 there is applied a voltage whose level is Vcc/2 that represents the threshold level voltage Vref of the inverter amplifier 1.

Figure 9:
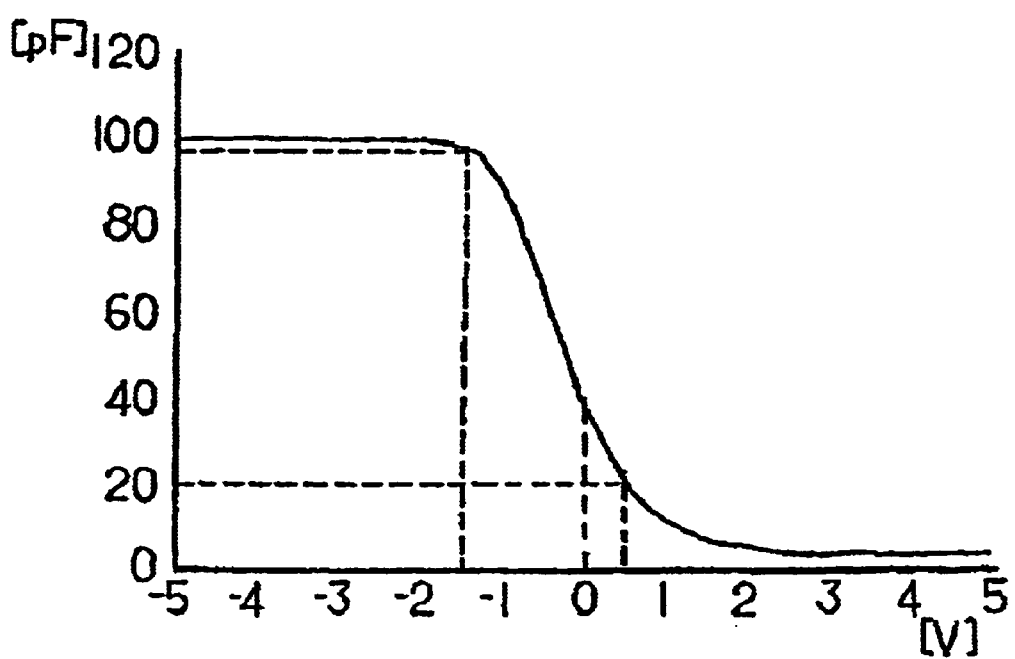
FIG. 9 illustrates the relationship between a terminal-to-terminal voltage and a capacitance value of the MOS construction type capacitance element.

And, in a case where having supplied a direct current control voltage, whose level is from 0V to Vcc, to the control terminal Vcont, the terminal-to-terminal voltage of the MOS construction type capacitance element 3 varies within a range of from −Vcc/2 to Vcc/2 with the potential at a point of connection between the control terminal Vcont and the input terminal of the inverter amplifier 1 operating as a basis. Therefore, resultantly, both a positive and a negative voltage are applied to the MOS construction type capacitance element 3 as was previously explained using FIG. 9, with the result that the capacitance value thereof varies over a wide range.

Namely, for example, in a case where the inverter amplifier 1 operates with a power supply voltage Vcc=5V, the one terminal of the MOS construction type capacitance element 3 is applied with the threshold voltage Vref of the inverter amplifier 1, whose level is Vref=2.5V. Further, at this time, when a control voltage (Vcont) falling within a range of from 0V to 5V is supplied to the control terminal Vcont as a positive voltage, the terminal voltage Vcont−Vref of the MOS construction type capacitance element 3 is controlled within a range of from −2.5V to +2.5V. Therefore, it is possible to control the value of the capacitance over a wide range without using a minus power supply as in the conventional example.

The oscillation circuit according to the invention has the effects that will be explained below in addition to the above-described function and effect.

Namely, in the above-described construction, the MOS construction type capacitance element 3 is inserted into within a loop of oscillation. Therefore, to the terminal on the inverter amplifier 1 side of it, there is applied an alternating current voltage, operating as an oscillation signal, the intermediate voltage of that is the threshold voltage Vref whose level is Vref=2.5v.

And, there is the phenomenon that the amplitude level of the alternating current voltage affects the sensitivity to variable capacitance of the MOS construction type capacitance element 3. By positively utilizing this property, it is possible to suppress the sensitivity to variable capacitance of the MOS construction type capacitance element 3 to an arbitrary value.

That will hereafter be explained in detail.

Figure 2A:
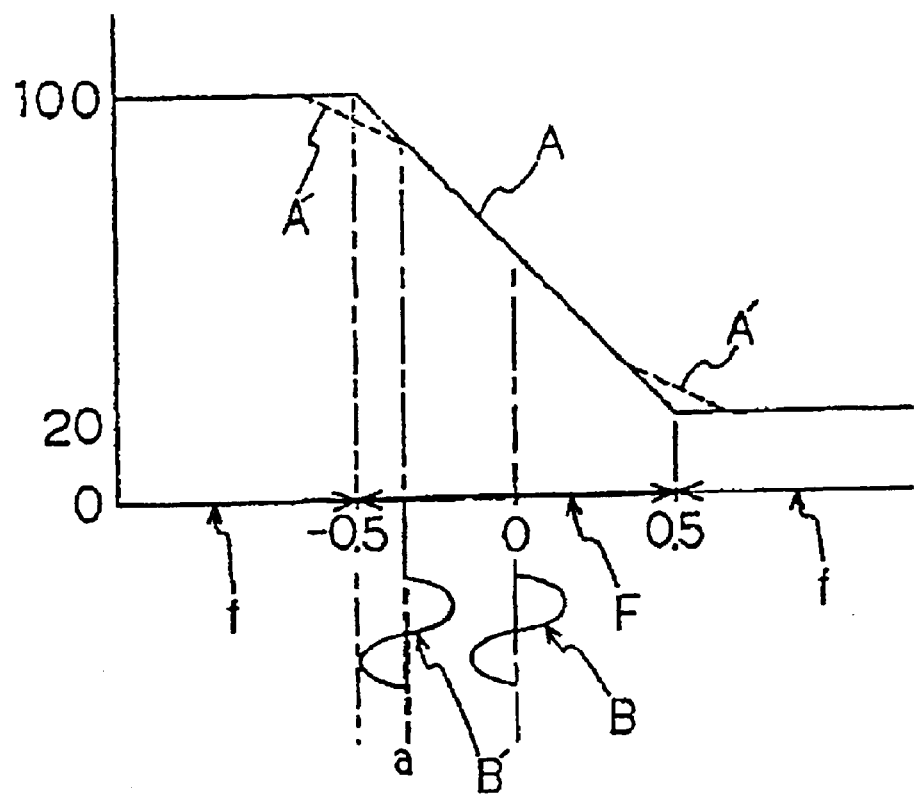
FIGS. 2(*a*) and 2(*b*) illustrate a method of controlling the sensitivity to variable capacitance of the crystal oscillator according to the present invention, FIG. 2(*a*) being for illustrating a case where no control is made of the sensitivity to variable capacitance and FIG. 2(*b*) being for illustrating a case where control is made of the variable capacitance sensitivity.
Figure 2B:
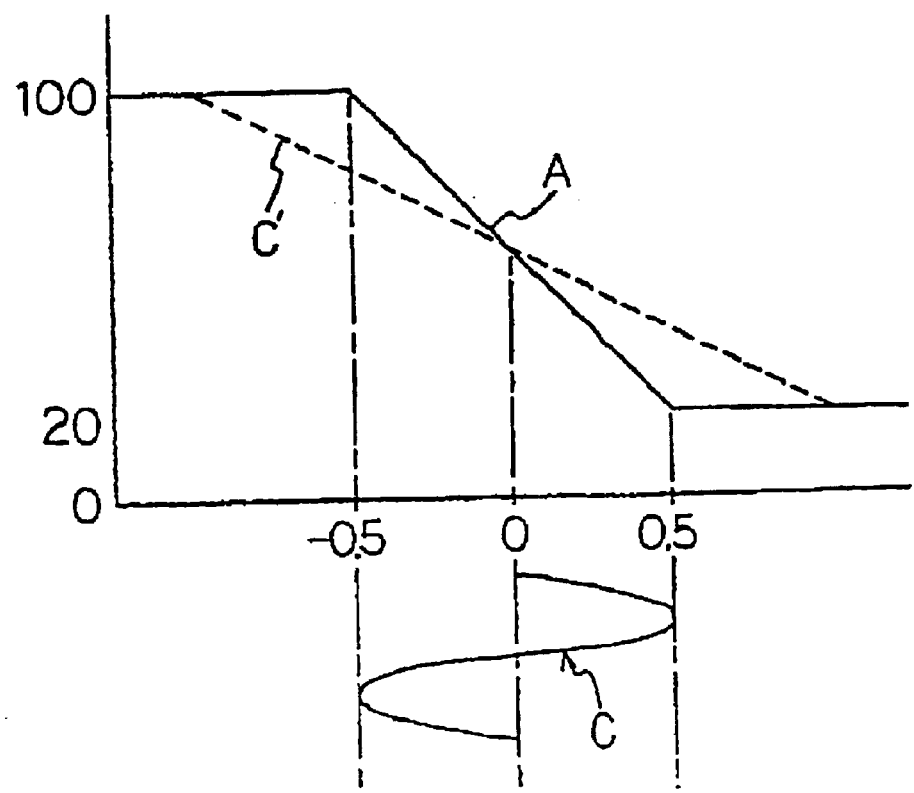

Here, for better understanding of the matter, it is assumed that the relationship between the terminal-to-terminal voltage and the capacitance value of the MOS construction type capacitance element be set such that, as illustrated in FIGS. 2(a) and 2(b), the capacitance value varies in response to a control-voltage range of from −0.5V to +0.5V with the intra-terminal voltage of 0V as the center.

In FIG. 2(a), the solid line A illustrates the relationship between the intra-terminal voltage and the value of the intra-terminal capacitance that holds true when a direct current voltage Vref=2.5V, equal in level to the threshold voltage, is applied to one terminal of the MOS construction type capacitance element and a positive-polarity direct current control voltage about 2.5V as the center is applied to the other terminal of it. As seen, in a non-saturation region, in which the capacitance value linearly greatly varies, there is obtained a high sensitivity to variable capacitance of 80 pF/V or so.

Regarding such MOS construction type capacitance element, under the assumption that the voltage Vref applied thereto be a bias voltage of 2.5V applied to the input terminal of the inverter amplifier 1, let's consider a case where that voltage Vref is an oscillation alternating current voltage, which varies about the center voltage of 2.5V, and which is fed back to the input end of the inverter amplifier 1.

First, assuming that such oscillation alternating current voltage be an alternating current voltage B whose amplitude level is much lower than the amplitude width of the voltage in the non-saturation region (F) as illustrated in FIG. 2(a), the terminal-to-terminal capacitance value varies with a change of the half cycles on the plus side and on the minus side of the alternating current voltage B. However, resultantly, the terminal-to-terminal capacitance value becomes approximately an average value of the thus-varied values.

When in this state the control voltage Vcont decreases for example beyond a dotted line (a) in the figure, the half cycles on the minus side of the alternating current voltage B reach the saturation region (f). Thereby, the amount of change in the capacitance decreases correspondingly to the half cycles on the minus side. And, the amount of change in the capacitance du to a change in voltage of the half cycles on the plus side becomes predominant. As a result of this, the intra-terminal sensitivity to capacitance value becomes low at the position where the alternating current voltage B reaches the saturation region as indicated in a dotted line A'. As a result of this, the range of the control voltage Vcont, which is followed by a change in the capacitance, becomes enlarged.

On the other hand, when the amplitude level in the oscillation alternating current voltage is set to be an alternating current voltage C approximately equal to the width of the non-saturation voltage region as illustrated in FIG. 2(b), merely slightly decreasing the terminal-to-terminal voltage for example is followed by the arrival of the half cycles on the minus side of the alternating current voltage C at the saturation region. Therefore, the amount of change in capacitance that corresponds to the half cycles on the minus side in the region of the terminal-to-terminal voltage whose level is lower than that of such slightly decreased terminal-to-terminal voltage becomes small. Conversely, when making the level of the voltage Vcont higher than 0V, the MOS construction type capacitance element operates also similarly. Therefore, the capacitance sensitivity to terminal-to-terminal's voltage becomes wide in range as indicated in dotted line C', namely widely varies with respect to the terminal-to-terminal voltage. Resultantly, it is possible to make the variable-capacitance sensitivity to 40 pF/V.

Incidentally, in the foregoing explanation, the explanation has been made on the premise that the alternating current voltage C has an amplitude level substantially equal to the width of the voltage in the non-saturation region (F). However, if such alternating current voltage C has an amplitude level that with respect to the non-saturation region is approximately 50% or more of the voltage level corresponding thereto, it is possible to obtain a sufficient practical variable-capacitance sensitivity.

Also, the control of the amplitude level of the alternating current voltage can be easily realized by adjusting the resistance value of, for example, the resistor R2.

Figure 3A:
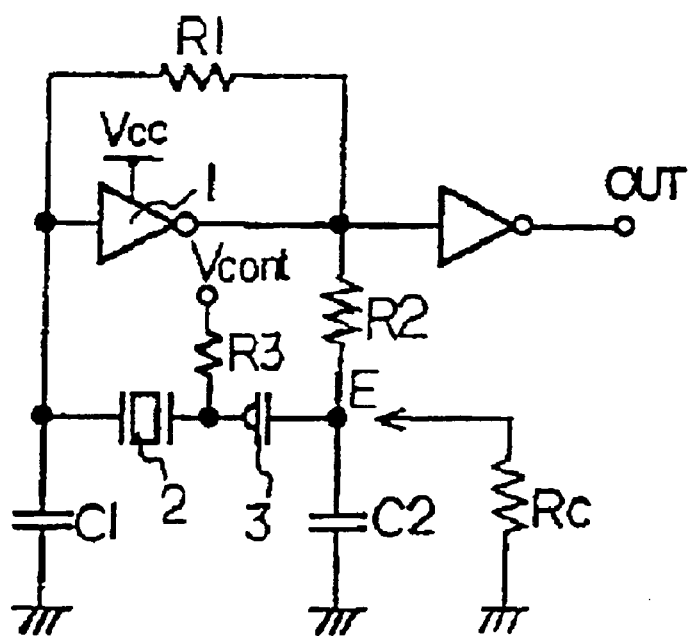
FIGS. 3(*a*) and 3(*b*) are circuit diagrams illustrating other embodiments of the crystal oscillator according to the present invention, FIG. 3(*a*) being a circuit diagram illustrating one of said other embodiments of the crystal oscillator according to the present invention and FIG. 3(*b*) being a circuit diagram illustrating the other of said other embodiments of the crystal oscillator according to the present invention.
Figure 3B:
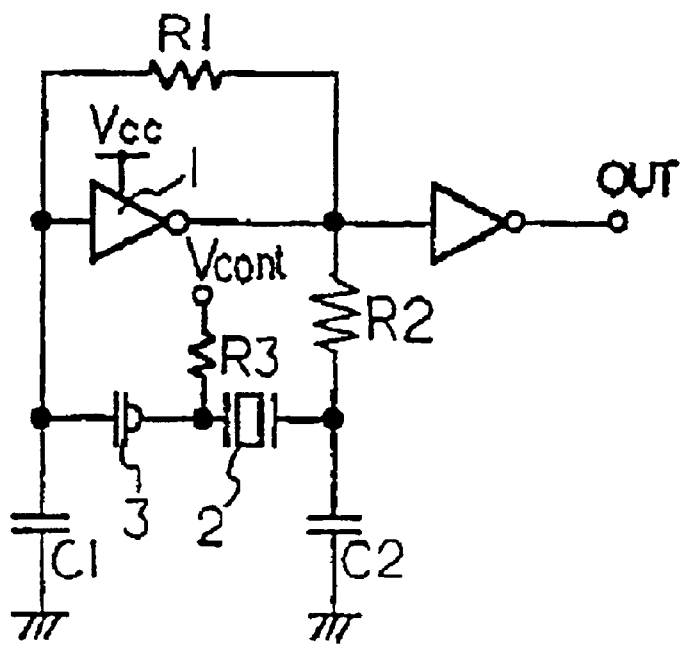

FIGS. 3(a) and 3(b) are circuit diagrams illustrating other embodiments of the crystal oscillator according to the present invention.

The point at which the crystal oscillator illustrated in each of FIGS. 3(a) and 3(b) differs from that illustrated in FIG. 1 is that the MOS construction type capacitance element 3 is inserted into between the crystal resonator 2 and the capacitor C1 or between the crystal resonator 2 and the capacitor C2. The circuit of FIG. 3(a) is constructed in such a form wherein one terminal of the MOS construction type capacitance element is connected to the output of the inverter amplifier 1 while the circuit of FIG. 3(b) is constructed in such a form wherein one terminal of the MOS construction type capacitance element is connected to the input of the inverter amplifier and the other terminal thereof is connected to the control terminal Vcont via a resistor R3.

Further, if as illustrated in FIG. 3(a) a fixed resistor or variable resistor Rc is inserted into between the point E in the circuit and the ground whereby the value of this resistor Rc is made arbitrarily settable, the voltage at the point E becomes controllable. As a result of this, the terminal-to-terminal's voltage of the MOS construction type capacitance element is controlled, which enables adjusting the frequency of the oscillation circuit.

Figure 4:
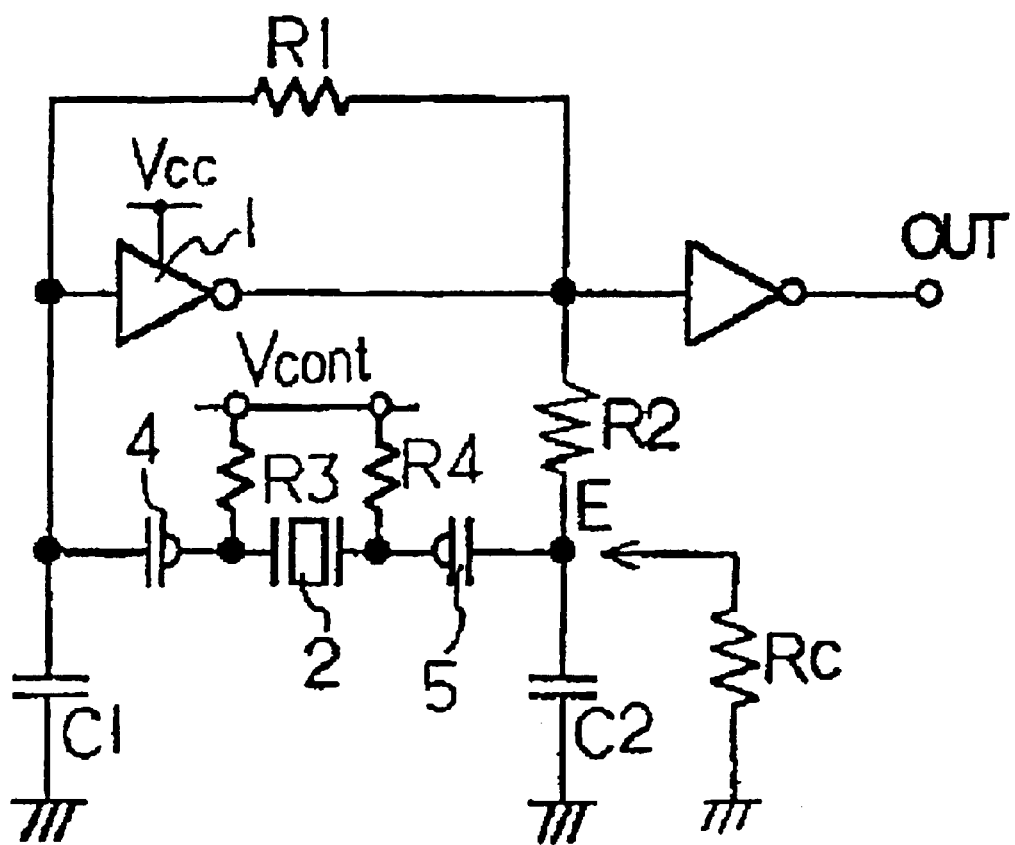
FIG. 4 is a circuit diagram illustrating still another embodiment of the crystal oscillator according to the present invention.

FIG. 4 is a circuit diagram illustrating still another embodiment of the crystal oscillator according to the present invention.

The respect in which the crystal oscillator illustrated in FIG. 4 differs from those illustrated in FIGS. 1, 3(a) and 3(b) is that the MOS construction type capacitance element 4 is inserted into between the crystal resonator 2 and the capacitor C1 and the MOS construction type capacitance element 5 is inserted into between the crystal resonator 2 and the capacitor C2. It is thereby arranged that either one of such MOS construction type capacitance elements has its one terminal connected to either one of the input and output terminals of the inverter amplifier 1 and has its other terminal connected to the control terminal Vcont via a resistor R3 or R4.

The respect in that the crystal oscillator illustrated in each of these figures is characterized is that the amplitude level of an alternating current voltage and a direct current bias voltage, which is a reference voltage, supplied to the MOS construction type capacitance element 3, are made respectively separately adjustable.

And it is clear that with such construction a wider range of variable capacitance values is obtained. So, newly giving an explanation of that is omitted.

Figure 5A:
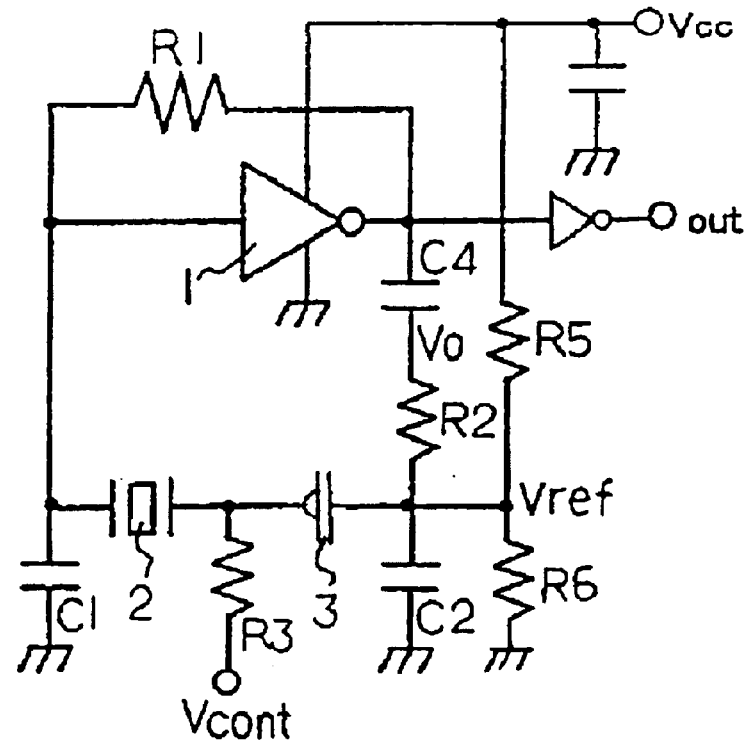
FIGS. 5(*a*) and 5(*b*) are circuit diagrams illustrating further embodiments of the crystal oscillator according to the present invention.
Figure 5B:
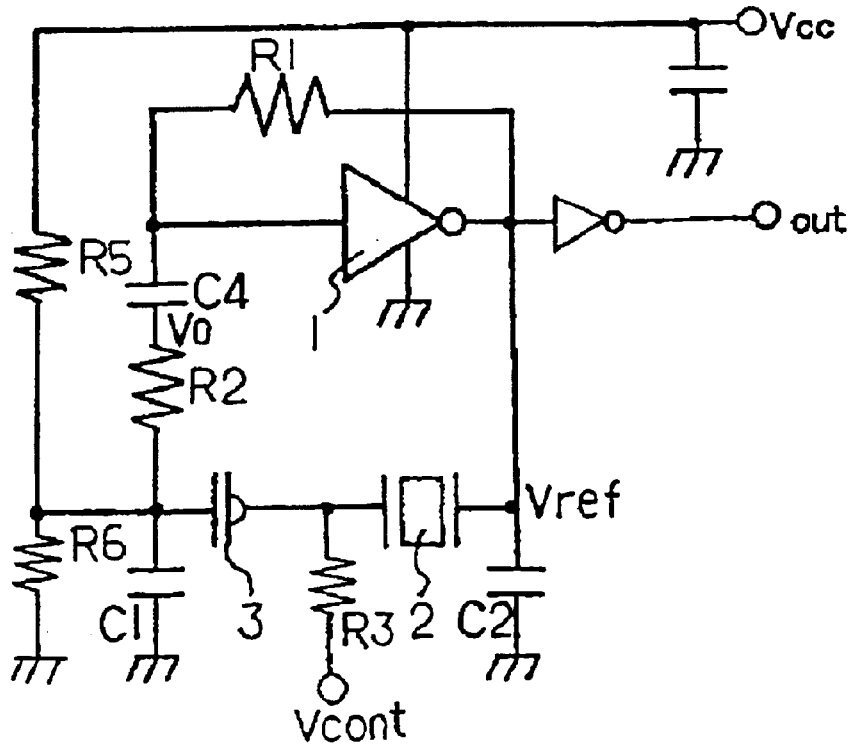
Figure 6:
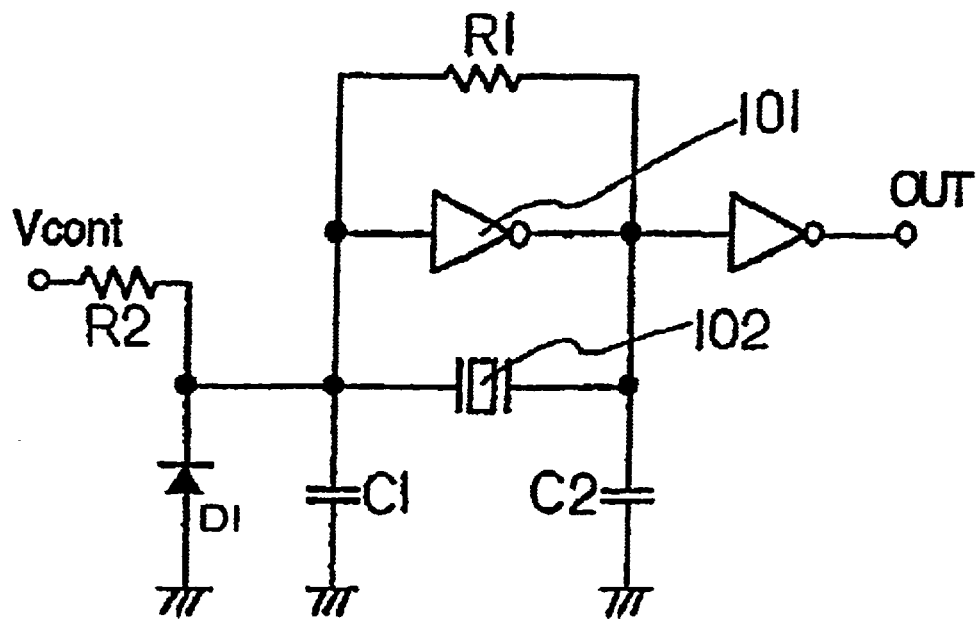
FIG. 6 is a circuit diagram illustrating a conventional crystal oscillator.
Figure 7:
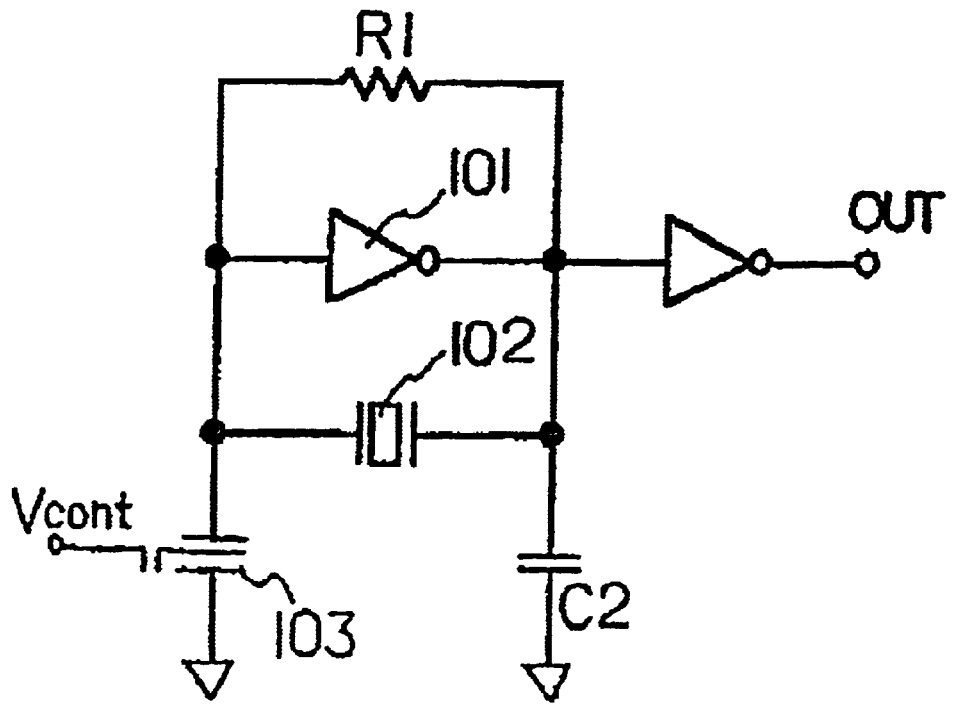
FIG. 7 is a circuit diagram illustrating a conventional crystal oscillator using a MOS construction type capacitance element.
Figure 8:
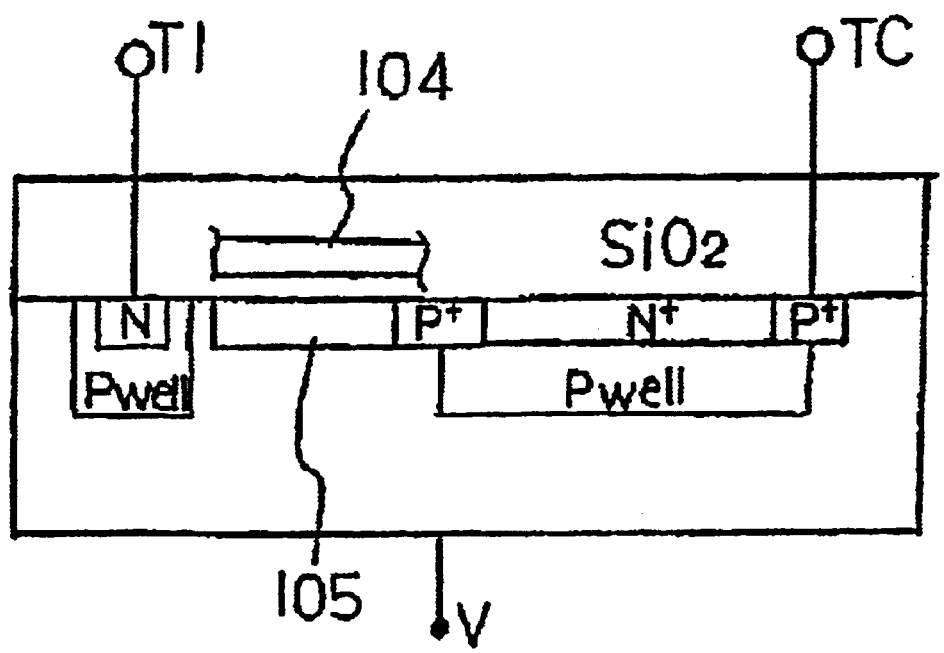
FIG. 8 is a view of a sectional structure of the MOS construction type capacitance element.

FIGS. 5(a) and 5(b) are circuit diagrams illustrating further embodiments of the crystal oscillator according to the present invention.

The respect in that the crystal oscillator illustrated in each of the figures is characterized is that the amplitude lavel of an alternating current voltage and a direct current bias voltage, which is a reference voltage, supplied to the MOS construction type capacitance element 3, are made respectively separately adjustable.

Namely, the crystal oscillator is constructed as follows. As illustrated in each of those figures, the MOS construction type capacitance element 3 is inserted between the crystal resonator 2 and the capacitor C1 or between the crystal resonator 2 and the capacitor C2. A central point of connection between the crystal resonator 2 and the MOS construction type capacitance element 3 is connected to the control terminal Vcont via a resistor R3. Further, the other terminal of the MOS construction type capacitance element 3 is connected to a central point of connection in a series circuit of a resistor R5 and a resistor R6, which is connected between a power supply Vcc and the ground. On the other hand, said other terminal of the MOS construction type capacitance element 3, as illustrated in (a) of the figures, is connected to an output side of the inverter amplifier 1 and, as illustrated in (b) of the figures, is connected to an input side of the inverter amplifier 1, via a series circuit of a resistor R2 and a capacitor C4.

And, by constructing the circuit like that, initially, according to the relational expression of Vref (DC)=R6×Vcc/(R5+R6), setting is performed of the reference voltage value Vref for the direct current bias voltage applied to the MOS construction type capacitance element 3 to thereby adjust the reference capacitance value of this element 3. Thereafter, according to the relational expression of Vref (AC)=R5×R6×V0/((R5+R6)×(R2+R5×R6/(R5+R6)), adjustment is performed of only the resistance value alone of the resistor R2. Setting is thereby performed of the amplitude of the alternating current voltage supplied to the MOS construction type capacitance element 3. If thereby adjusting the sensitivity to capacitance of the MOS construction type capacitance element 3, this adjusting of the sensitivity to capacitance has no effect upon the set value of the reference capacitance. Resultantly, the process of adjusting the crystal oscillator is simplified.

It is to be noted that the V0 represents the amplitude level of the alternating current component of the input/output voltage of the inverter amplifier 1.

In the foregoing description, the present invention has been explained using the construction of applying the threshold voltage of the inverter amplifier 1 to one terminal of the MOS construction type capacitance element 3. However, the invention is not limited to such construction. But the invention may have a construction wherein a fixed voltage is applied to the one terminal of the MOS construction type capacitance element 3 with use of an external voltage or using a voltage that is produced using another voltage generation circuit, etc.

Further, although in the foregoing description the present invention has been explained taking up the oscillator using a crystal resonator as an example, the invention is not limited to such oscillator. But it is apparent that the invention may be applied to another oscillator that uses a piezoelectric resonator other than the crystal resonator.

As has been explained above, the piezoelectric oscillator according to the present invention is constructed as described above. It therefore advantageously becomes possible to control the oscillation frequency widely and highly precisely without necessitating a complex-systematic construction for controlling the frequency.

What is claimed is:

1. A piezoelectric oscillator, wherein, in an oscillator including a piezoelectric resonator, an amplifier, and a variable-capacitance element, the variable-capacitance element is a MOS construction type capacitance element, one terminal of the MOS construction type capacitance element is applied with an alternating current voltage, whose intermediate voltage is a positive (plus) or negative (minus) V voltage, and the other terminal of the MOS construction type capacitance element is applied with a control voltage within a range whose intermediate value is the V voltage and of a same polarity as the V voltage and at least one terminal of the MOS construction type capacitance element is connected to ground via a capacitor.

2. A piezoelectric oscillator, wherein, in an inverter piezoelectric oscillator in which a piezoelectric resonator is connected between an input terminal and an output terminal of an inverter amplifier; and divisional capacitors C1 and C2 are connected between respective ends of the piezoelectric resonator and a ground, and wherein by inserting a MOS construction type capacitance element in series with the piezoelectric resonator, one end of the MOS construction type capacitance element is applied with a bias voltage which is a positive (plus) or negative (minus) V voltage at an output end or input end of the inverter amplifier and the other end of the MOS construction type capacitance element is supplied with a control voltage that varies within a range whose intermediate value is the V voltage and of a same polarity as the V voltage, and at least one terminal of the MOS construction type capacitance element is connected to the ground via said divisional capacitor C1 or C2.

3. A piezoelectric oscillators, wherein, in an inverter piezoelectric oscillator in which a piezoelectric resonator is connected between an input terminal and an output terminal of an inverter amplifier; and divisional capacitors C1 and C2 are connected between respective ends of the piezoelectric resonator and the ground, and wherein two MOS construction type capacitance elements are inserted respectively on both sides of the piezoelectric resonator; one end of each of the MOS construction type capacitance elements is applied with an alternating current voltage whose intermediate voltage is a V voltage; and the other end of each of the MOS construction type capacitance elements is applied with a control voltage that varies within a range whose intermediate value is the V voltage.

4. A piezoelectric oscillator, wherein, in an inverter oscillator in which a piezoelectric element is connected to an input or output end of an inverter amplifier; and divisional capacitors C1 and C2 are connected between respective ends of the piezoelectric element and a ground, and wherein a MOS construction type capacitance element is inserted between the piezoelectric element and an input end of the inverter amplifier or between the piezoelectric element and an output end of the inverter amplifier; a control voltage Vcont is applied to the terminal on a connection-to-piezoelectric element side of the MOS construction type capacitance element; and, when it is assumed that V represents a positive (plus) or negative (minus) voltage that is a direct current bias voltage at the input end or output end of the inverter amplifier and that is applied to one end of the MOS construction type capacitance element and at least one terminal of the MOS construction type capacitance element is connected to the ground via said divisional capacitor C1 or C2, it is arranged that said voltage becomes an intermediate voltage of the control voltage Vcont and of a same polarity as the control voltage Vcont.

5. A piezoelectric oscillator, wherein, in an inverter oscillator in which a piezoelectric element is connected to an input or output end of an inverter amplifier; and divisional capacitors C1 and C2 are connected between respective ends of the piezoelectric element and a ground, and wherein a MOS construction type capacitance element is inserted between the piezoelectric resonator and an input end of the inverter amplifier or between the piezoelectric resonator and an output end of the inverter amplifier; a control voltage Vcont is applied to a terminal on the connection-to-piezoelectric resonator side of the MOS construction type capacitance element; and a direct current circuit of a resistor and a capacitor is inserted and connected between a terminal on the inverter-amplifier side of the MOS construction type capacitance element and the input or output terminal of the inverter amplifier; and further a direct current bias voltage is applied to the terminal on the inverter-amplifier side of the MOS construction type capacitance element.

6. A piezoelectric oscillator according to claim 5, wherein the amplitude level of an alternating current supplied to the MOS construction type capacitance element is adjusted according to the value of the resistance of the direct current circuit; and when it is assumed that V represents the direct current bias voltage supplied to the terminal on the inverter-amplifier side of the MOS construction type capacitance element, it is arranged that the direct current bias voltage V becomes an intermediate voltage of the control voltage Vcont.

* * * * *